United States Patent [19]
Ishijima et al.

[11] Patent Number: 4,960,140
[45] Date of Patent: Oct. 2, 1990

[54] WASHING ARRANGEMENT FOR AND METHOD OF WASHING LEAD FRAMES

[75] Inventors: Akira Ishijima; Toshihiko Beppu; Gunpei Kikuchi, all of Tokyo, Japan

[73] Assignees: Ishijima Industrial Co., Ltd.; Ebara Corporation, both of Japan

[21] Appl. No.: 803,105

[22] Filed: Nov. 27, 1985

[30] Foreign Application Priority Data

Nov. 30, 1984 [JP] Japan .................. 59-251968

[51] Int. Cl.⁵ .............................................. B08B 5/00
[52] U.S. Cl. ........................................ 134/31; 134/68; 134/72; 134/57 R; 134/131; 134/198; 134/199; 134/200
[58] Field of Search ............... 134/25.1, 25.5, 31.26, 134/68, 72, 57 R, 131, 198, 199, 61, 200, 32

[56] References Cited

U.S. PATENT DOCUMENTS 4,319,930 3/1982 Yano et al. ................. 134/25.4
4,560,417 12/1985 Bardina et al. ................ 134/30

FOREIGN PATENT DOCUMENTS 55-44780 3/1980 Japan .

Primary Examiner—Helen M. S. Sneed
Assistant Examiner—Sharon T. Cohen
Attorney, Agent, or Firm—Steinberg & Raskin

[57] ABSTRACT

A washing arrangement for and method of removing burrs of moldable substances from upper and lower major surfaces of lead frames on portions of which the burrs were undesirably applied during molding comprises a transfer assembly which is located outside a washing chamber of the arrangement. The transfer assembly is not subject to the hot and humid environment existing within the washing chamber, thereby preventing corrosion, and facilitating ready inspection and maintenance of the arrangement.

19 Claims, 8 Drawing Sheets

WASHING ARRANGEMENT FOR AND METHOD OF WASHING LEAD FRAMES

BACKGROUND OF THE INVENTION

1. Field of the Invention

The present invention generally relates to a washing arrangement for and a method of washing lead frames of semiconductor products such as integrated circuits and large-scale integrated circuits. Still more particularly, this invention relates to removing lead burrs and dam burrs from such lead frames.

2. Description of the Prior Art

During the course of manufacturing a semiconductor product such as an integrated circuit, a large-scale integrated circuit or the like, a synthetic resin or like moldable substance is applied over a lead frame. The lead frame typically has a plurality of leads extending in a longitudinal direction, and a plurality of dams extending between the leads in a transverse direction. The lead frame also has open spaces or gaps in the areas bounded by the leads and dams.

When the synthetic resin in a molten state is applied over designated areas of the lead frame during the manufacture of the semiconductor product, a non-negligible amount of the molten resin overflows from the intended designated areas and spills over onto and attaches, after setting, to portions of the leads and/or the dams and/or the aforementioned gaps. In the art, the overflowed resins attached to the leads are known as lead burrs; and the overflowed resins attached to the dams and/or the gaps are known as dam burrs. These burrs hinder subsequent steps in the manufacture of the semiconductor product. For example, the lead burrs hinder the subsequent plating step in which the leads are plated. The dam burrs hinder a subsequent step of cutting the dams. To counter such hindrances, it is conventional in the art to remove these burrs after the resin molding step.

In one prior art arrangement for removing such burrs, a soft polishing material such as crushed walnut powder is conveyed along a pressurized stream to the lead frame in order to remove the burrs by abrasion. However, the use of walnut powder has not proven to be altogether satisfactory in practice, because the powder strongly attaches itself to the lead frame, thereby requiring a great deal of time, labor and expense to remove and clean the powder from the frame. In addition, large amounts of walnut powder are utilized, and a large-sized recovery assembly is required to recover the powder. A dust collector is also necessary. The size of the overall arrangement is quite large. Furthermore, in the subsequent dam coating step, even small amounts of non-removed walnut powder attached to the dams and/or gaps abrade the cutter, thereby wearing the cutting blade and contributing to a short working lifetime.

In another prior art arrangement for removing such burrs, high-pressure water jets are conveyed to the lead frame to remove the burrs by impact therewith. However, the use of pressurized water in the known arrangements has not proven to be altogether satisfactory, because a lead frame transfer assembly for conveying the lead frames into and out of a washing chamber is located within the washing chamber itself. The atmosphere within the washing chamber is very humid and hot, and the placement of the transfer assembly within the washing chamber leads to many problems. For example, the transfer assembly, having metallic moving parts, is subject to rapid corrosion. Also, inspection and maintenance of the transfer assembly and the overall washing arrangement are inconvenient and time-consuming to perform.

SUMMARY OF THE INVENTION

1. Objects of the Invention

It is a general object of this invention to overcome the aforementioned drawbacks of prior art arrangements for removing burrs from lead frames.

It is another object of this invention to effectively remove burrs without using soft polishing materials such as walnut powder, without using dust collectors, without using powder recovery systems, and without utilizing large-scale arrangements.

It is a further object of this invention to effectively remove burrs by washing the lead frames in a washing chamber without, at the same time, subjecting a lead frame transfer assembly to excess humidity and heat, thereby protecting the assembly from corrosion.

Still another object of this invention is to render the inspection and maintenance of the washing arrangement easy and convenient to perform.

Yet another object of this invention is to provide an efficient, reliable, compact washing arrangement for and method of removing burrs from lead frames.

2. Features of the Invention

In keeping with these objects, and others which will become apparent hereinafter, one feature of this invention resides, briefly stated, in an arrangement for and a method of removing burrs of moldable substances, i.e. synthetic resin material, from upper and lower major surfaces of lead frames on portions of which the burrs were undesirably applied during molding. For example, lead burrs and dam burrs frequently and unavoidably are formed during the manufacture of a semiconductor product such as an integrated circuit, a large-scale integrated circuit or the like.

The arrangement comprises a washing means including a washing workstation for directing washing fluids under pressure to upper and lower major surfaces of lead frames within the washing workstation. The washing workstation has a washing chamber bounded by walls, one of which is movable. The arrangement further comprises means for moving the one movable wall between open and closed positions in which the washing chamber is opened and closed, respectively.

In further accordance with this invention, the arrangement comprises supply means, including a supply workstation, for successively supplying burr-bearing lead frames to the washing workstation; dryer means including a drying workstation for successively drying the lead frames washed by the washing means; and discharge means including a discharge workstation for successively discharging the lead frames dried by the dryer means.

In further accordance with this invention, the arrangement comprises transfer means for conveying the lead frames along a path through the workstations. The transfer means is located outside the washing chamber and, hence, the transfer means is not subjected to the humidity and heated environment within the washing chamber. The transfer assembly of this invention is thus not subject to the corrosion problems of the prior art arrangement. The transfer means is operative to convey each lead frame from the supply workstation to and from the washing workstation in the open position of the one movable wall, and to successively convey each lead frame, after washing, through the drying workstation and to the discharge workstation. In other words, the transfer means is so arranged outside the washing chamber so that it does not interfere with the movement of the one movable wall of the washing chamber and, in fact, cooperates with such movement in order to deliver to and retrieve from the washing chamber each lead frame in its turn.

In a preferred embodiment of this invention, the washing means includes top and bottom washers respectively arranged above and below a pair of lead frames within the washing chamber. The top washer is operative for directing the washing fluids onto the upper surface of one of the lead frames within the washing chamber, and the bottom washer is operative for directing the washing fluids onto the lower surface of the other lead frame within the washing chamber.

The washing means further includes two holder means for holding the lead frames within the washing workstation. Each holder means includes a stationary support plate stationarily mounted on the one movable wall of the washing chamber, and a movable plate mounted for movement relative to the stationary plate between an access position in which each lead frame is mounted on the stationary plate, and a clamped position in which the respective lead frame is clamped between the stationary and movable plates.

It is further advantageous if the stationary and movable plates are provided with a plurality of masked openings extending therethrough so that the top and bottom washers may direct their respective washing fluids through the masked openings and onto the burrs.

Still another feature of this invention resides in providing a plurality of suction nozzles as part of the transfer means. The transfer means includes means for lowering each suction nozzle into engagement with a respective lead frame in a workstation, for thereupon lifting each engaged suction nozzle to raise the respective lead frame, for thereupon shifting each raised suction nozzle downstream of the path to the next workstation, and for thereupon lowering each shifted suction nozzle into the next workstation to constitute an operating cycle. This operating cycle is repeated to convey the lead frames through the workstations.

The invention itself, however, both as to its construction and its method of operation, together with additional objects and advantages thereof, best will be understood from the following description of specific embodiments when read in connection with the accompanying drawings.

BRIEF DESCRIPTION OF THE DRAWINGS

FIG. 11a shows a washer nozzle assembly in elevation as used in the arrangement of FIGS. 3-6;

FIG. 11b is a side view of the washer nozzle assembly of FIG. 11a;

DETAILED DESCRIPTION OF THE PREFERRED EMBODIMENTS

Figure 1:
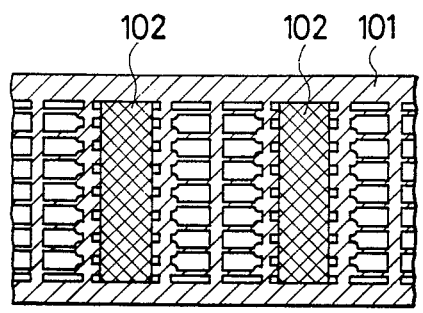
FIG. 1 is a fragmentary enlarged elevational view of a lead frame of a semi-conductor product to be washed by the arrangement of FIGS. 3-6 below.
Figure 2:
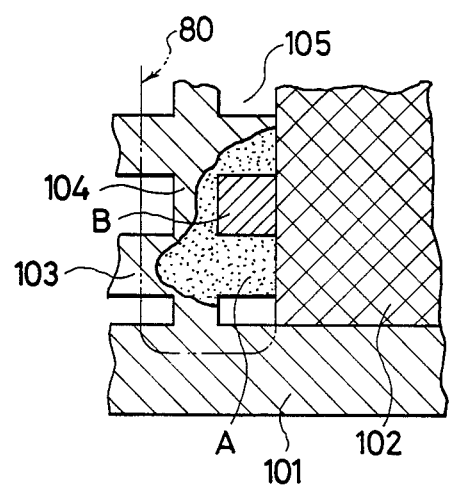
FIG. 2 is a greatly enlarged fragmentary elevational view of a portion of the lead frame of FIG. 1 and showing lead and dam burrs which are to be removed by the arrangement of FIGS. 3-6.

Referring now to the drawings and, more particularly, to FIGS. 1 and 2 thereof, reference numeral 101 generally identifies a lead frame on which a moldable substance, e.g. synthetic resin materials 102, are applied in a molten state during the course of manufacture of a semiconductor product such as an integrated circuit, a large-scale integrated circuit or the like. The synthetic resin materials 102 are applied over predetermined designated areas of the lead frame. The lead frame 101 has a plurality of leads 103 (see FIG. 2) extending generally parallel to one another in a longitudinal direction, and a plurality of dams 104 extending between each two adjacent leads in a transverse direction. Open spaces or gaps 105 are bounded by the leads 103, the dams 104 and the predetermined designated areas for the resin materials 102. As noted previously, when the resins 102 are applied onto the designated areas of the lead frame, a non-negligible small amount of the resins overflows and spills over onto the leads 103, the dams 104 and the gaps 105. Once the resins cure, the resins which attach to the leads 103 are known as lead burrs A, and the resins which attach to the dams 104 and/or gaps 105 are known as dam burrs B. As described below, a mask slot, shown in phantom at 80, delimits an area where lead burrs A and dam burrs B are to be removed.

The remaining figures of the drawings show a washer arrangement for and method of removing such burrs in accordance with this invention.

Figure 3:
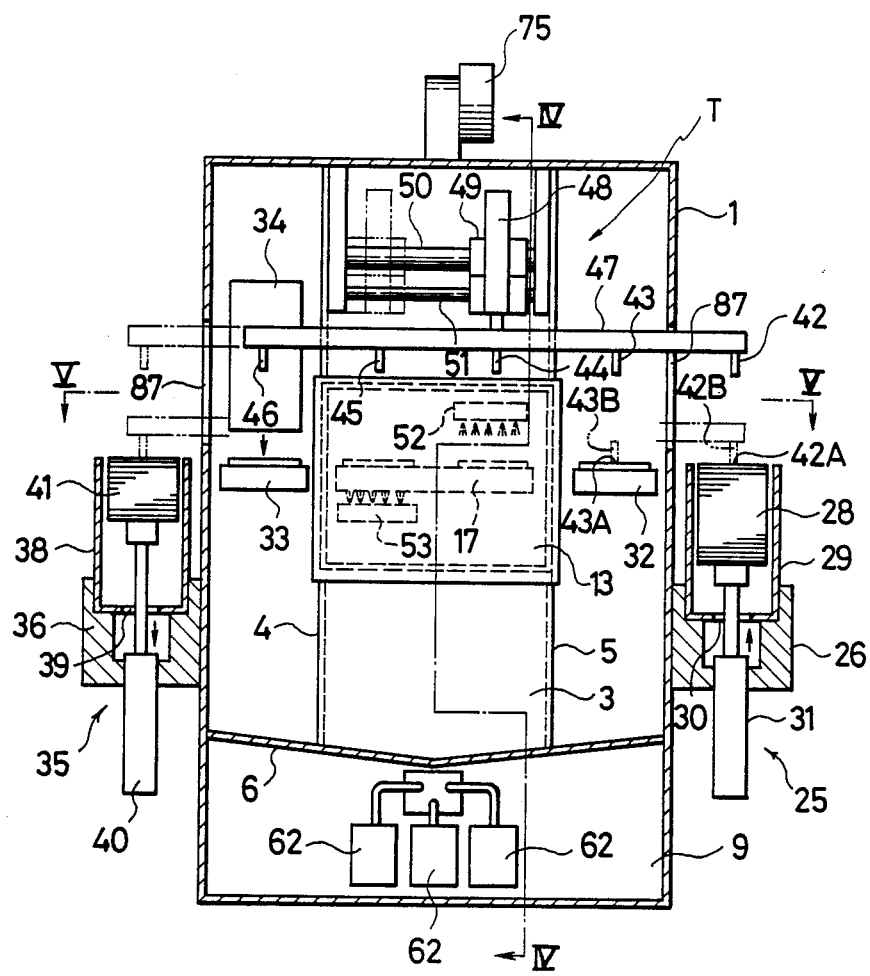
FIG. 3 is a longitudinal cross-sectional front view of a washing arrangement in accordance with this invention taken along the line III—III of FIG. 4.
Figure 4:
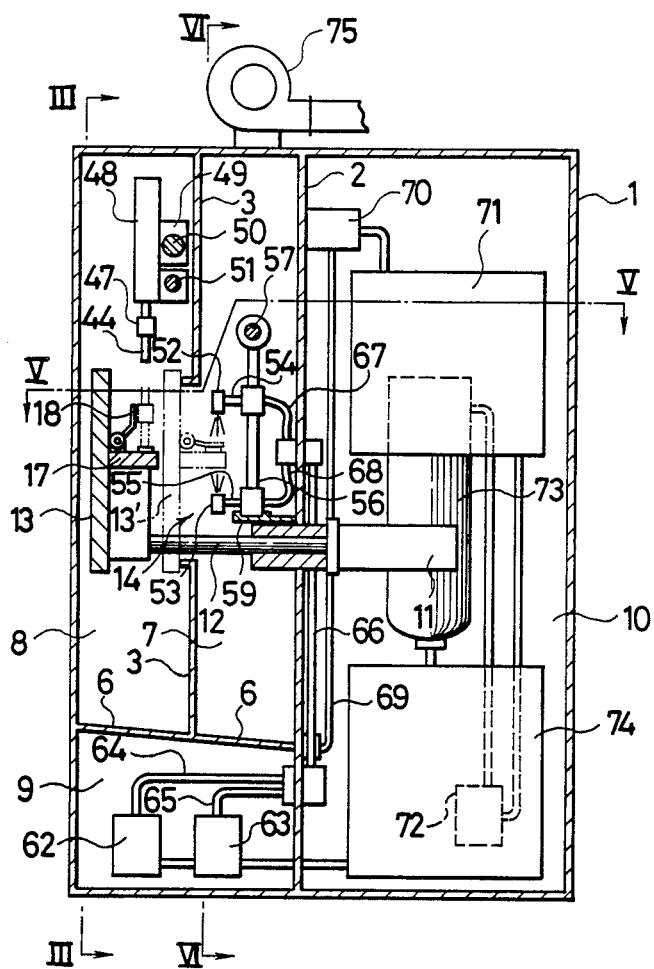
FIG. 4 is a longitudinal cross-sectional side view of the arrangement taken along the line IV—IV of FIG. 3.
Figure 5:
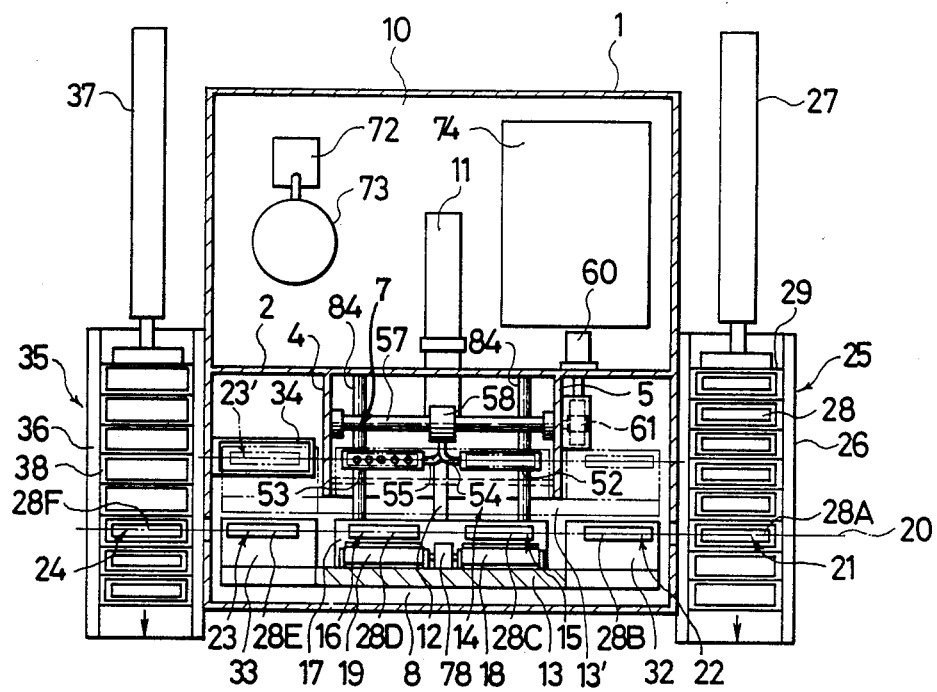
FIG. 5 is a transverse cross-sectional view of the arrangement taken along the line III—III of FIG. 3.
Figure 6:
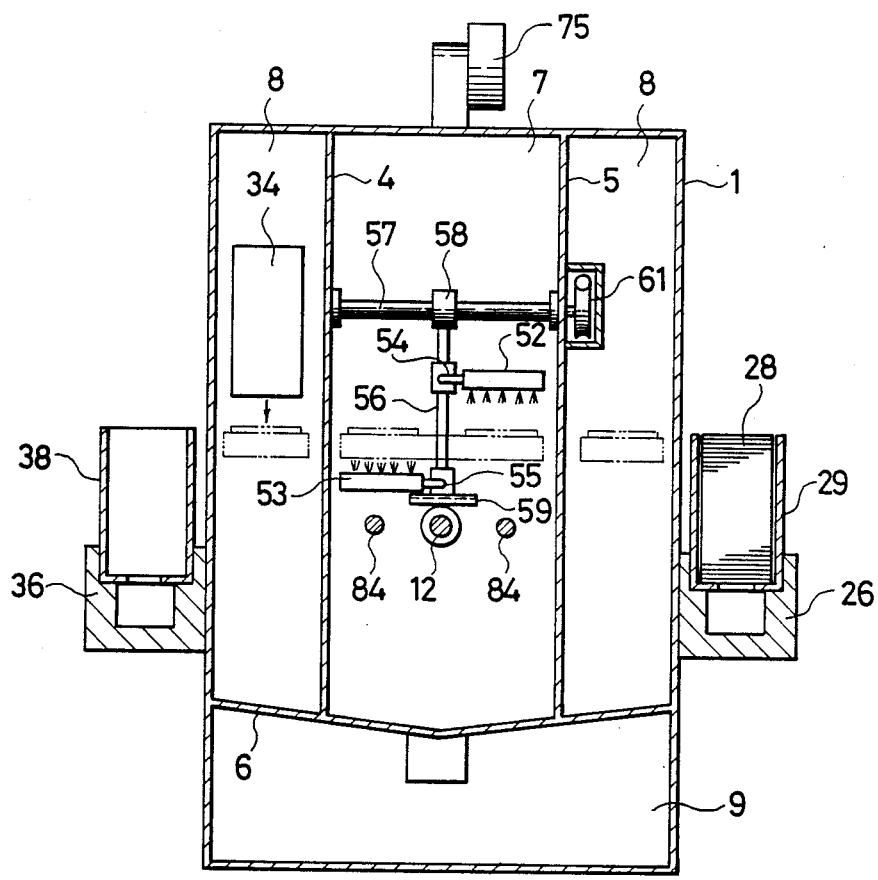
FIG. 6 is a transverse cross-sectional view of the arrangement taken along the line VI—VI of FIG. 4.

Turning, then, to FIG. 3, the arrangement comprises a casing 1 whose interior is subdivided into multiple chambers by planar partition walls 3, 4, 5 and 6. As shown in FIGS. 4 and 5, partition wall 2 extends across the entire width and height of the casing 1, and bounds, with the top, bottom and rear of the casing a rear tank chamber 10. Partition wall 3 lies forwardly of partition wall 2, and extends from the top of the casing toward the bottom, but terminates short thereof in the bottom partition wall 6 which extends at a slight angle rearwardly from the front of the casing to the partition wall 2. Partition walls 2, 3, 4, 5 and 6 bound the washing chamber 7. The partition wall 3 also bounds, with the front of the casing and with the partition walls 4, 5 and 6, a transfer chamber 8 which, as shown in FIG. 6, has two sections, one on either side of the casing. The bottom partition wall 6 is spaced above the bottom of the casing and bounds a pump chamber 9.

Still referring to FIGS. 3–5, the washing chamber 7 has a central opening 14. A front wall 13 is reciprocally movable toward and away from the opening 14 to seal and unseal, respectively, the opening 14. A drive unit comprising a cylinder 11 and a piston rod 12 is used to reciprocally move the front wall 13 between an open position (shown in solid lines in FIG. 4) in which the interior of the washing chamber 7 is opened, and a closed position (shown in phantom lines and designated by reference numeral 13' in FIG. 4) in which the interior of the washing chamber 7 is closed. As described below, the washing chamber 7 constitutes a washing workstation in which burr-bearing lead frames are washed when the front wall 13 seals the opening 14.

The cylinder 11 is stationarily mounted on the partition wall 2, and the movable piston rod 12 extends through the opening 14 and is connected to the front wall 13. A pair of guide bars 84 (see FIG. 5) are mounted between the partition wall 2 and the front of the casing 1. The guide bars 84 extend through the front wall 13 and guide the same during its reciprocal movement in both the forward and rearward directions.

A support shelf 17 is mounted rearwardly of the front wall 13 for joint movement therewith. A pair of holder means 15, 16 (see FIG. 5) are mounted on the shelf, each holder means being operative for holding a different lead frame. As explained below in connection with FIG. 7, holder means 15 holds one lead frame in place while an upper major surface thereof is being washed in the washing workstation within the washing chamber 7, and holder means 16 holds another lead frame in place while a lower major surface thereof is being washed in the washing workstation within the washing chamber 7. Holder means 15, 16 have movable holders, or masks, 18, 19, respectively, which, as described below, are movable from an access position in which a lead frame may be deposited on the shelf 17, and a closed position in which the deposited lead frame is clamped between the respective mask and the support shelf 17. The masks 18, 19 prevent the washing fluids from reaching those portions of the lead frame which are not required to be washed. The masks 18, 19 have openings which permit the washing fluids to reach those portions of the upper and lower major surfaces of the lead frame which are desired to be washed and freed of burrs.

Before describing the details of the washing operation within the washing workstation 7, reference is had to FIG. 5 wherein reference numeral 20 identifies a path of travel of the lead frames through the arrangement. Sequentially arranged along the path are a supply workstation 21, a waiting or intermediate workstation 22, the washing workstation 7, a drying workstation 23, and a discharge workstation 24. Although the travel path 20 in FIG. 5 is shown as being linear, other trajectories, such as arcuate paths, may also be utilized. The aforementioned workstations are spaced apart from one another by equal distances.

Supply means 25 is operative for successively supplying burr-bearing lead frames 28 along the path. The lead frames 28 are stacked in a rear-to-front direction in a guide 26 by a cylinder-and-piston unit 27. In addition, the lead frames 28 are vertically stacked one above another in a magazine 29 having a lower hole 30 (FIG. 3) through which a piston of a cylinder-and-piston unit 31 is received (FIG. 3). The unit 31 is operative to raise the lead frames 28 upwardly, whereas the unit 27 is operative to urge the lead frames forwardly.

The intermediate workstation 22 is optional, and includes an intermediate support 32 which is mounted for joint movement in both forward and rearward directions on the front wall 13. The intermediate support 32 may be secured to the casing 1 separate from the front wall 13.

The drying workstation 23 includes a drying support 33 which is likewise mounted on the front wall 13 for joint movement therewith in both forward and rearward directions. A lead frame supported by the support 33 may be held thereon by any fastening means such as, for example, a clip (not shown). As best shown in FIG. 5, the position occupied by the drying support in the closed position on the front wall 13 is identified by reference numeral 23'. A hot air dryer 34 is arranged over the position 23' of the drying support. The dryer 34 is operative to blow a stream of hot air to the lead frame supported by the drying support to dry the lead frame.

The discharge workstation 24 constitutes a part of a discharge means 35 operative for successively discharging the lead frames dried by the dryer 34. The discharge means 35 includes a stack of dried lead frames 41 stacked in a rear-to-front direction in a guide 36 by a cylinder-and-piston unit 37. In addition, the lead frames 41 are vertically stacked one above another in a magazine 38 having a lower hole 39 through which a piston of a cylinder-and-piston unit 40 is received. The unit 40 is operative to lower the lead frames 41, whereas the unit 37 is operative to urge the lead frames forwardly.

In accordance with this invention, transfer means T are operative for conveying the lead frames along the path 20 through the aforementioned workstations. By way of example, successive positions 28A; 28B; 28C, 28D; 28E; 28F are the positions occupied by a lead frame in workstations 21; 22; 7; 23; 24, respectively. The transfer means T is located outside the washing workstation 7, and is operative to convey each lead frame along the path 20 from the supply workstation 21 to the intermediate workstation 22, and then to the washing workstation 7 in the open position of the one movable wall, and thereupon to successively convey each lead frame, after washing, through the drying workstation 23 and to the discharge workstation 24.

The transfer means includes a plurality of suction nozzles 42, 43, 44, 45 and 46 which are equidistantly arranged apart from one another along a support bar 47 at intervals along the travel path 20 corresponding to the spacings among the supply workstation 21, the intermediate workstation 22, the holder means 15 in washing workstation 7, the holder means 16 in washing workstation 7, the drying workstation 23 and the discharge workstation 24. The suction nozzles 42–46 are connected to a vacuum source (not illustrated). Although each suction nozzle is shown as a single nozzle in the drawings, it will be understood that it is also within the scope of this invention that each of the reference numerals 42–46 may comprise a set of nozzles, each set being from two to six in number, and being spaced widthwise across the lead frame in each workstation.

The transfer means includes means for reciprocating the support bar 47 in vertical up-and-down directions into and out of the travel path 20 by a cylinder-and-piston drive unit 48 whose piston rod is connected to the support bar 47. The nozzles 42–46 participate in this up-and-down movement. The drive unit 48 is mounted on a shiftable block 49. The shiftable block 49 is reciprocally shifted sideways along both horizontal directions, as seen in FIG. 3, along a guide bar 51 by means of a rodless cylinder drive unit 50 having a magnet therein. The unit 50 reciprocates the block 49 and, of course, the nozzles 42–46 in the horizontal direction. Conventional control means (not illustrated) are provided for coordinating the up-and-down vertical movement of the nozzles 42–46 driven by the unit 48 with the reciprocal horizontal shifting of the nozzles driven by the unit 50, together with the application and removal of suction at the nozzles, as described below.

For instance, with reference to representative nozzle 42 in FIG. 3, the suction nozzle 42 is moved in the following manner: At the outset, the nozzle 42 is in its fully raised position, shown in solid lines. Then, the unit 48 lowers the nozzle 42 to the position 42A whereat the nozzle engages the topmost lead frame 28A. At the same time, a suction force is generated at the nozzle of sufficient strength to grip the lead frame 28A by suction.

Thereupon, the unit 48 lifts the nozzle and the lead frame 28A up a predetermined small distance so that the nozzle occupies position 42B which is below the initial position occupied by the nozzle 42. Thereupon, the unit 50 shifts the nozzle downstream of the path to position 43B whereat the lead frame, now identified by reference numeral 28B, is located above the intermediate support 32. Thereupon, the unit 48 lowers the nozzle until the lead frame 28B is deposited on the support 32. When the nozzle occupies position 43A, the suction force is removed, and the lead frame 28B is released. Thereupon, the unit 48 lifts the nozzle up again a predetermined small distance to position 43B. Thereupon, the unit 50 shifts the nozzle back to the position 42B. Thereupon, the unit 48 re-lowers the nozzle 42 down to position 42A, whereupon the suction force is re-applied to grip the next lead frame. The movement of nozzle 42 successively among positions 42A, 42B, 43B, 43A, 43B, 42B and 42A constitutes one operating cycle. This operating cycle is repeated during operation of the arrangement.

In a variant embodiment, rather than raising the nozzle 42 up a predetermined small distance to positions 42B and 43B, the nozzle 42, during its operating cycle, may be lifted to fully raised positions which are located above the upper edge of the front wall 13. In this variant, the travel time of each operating cycle is increased due to the greater distance through which the nozzles are moved, but the overall system control is simplified.

The other suction nozzles 43–46 are moved simultaneously in the same operating cycle as that just discussed for nozzle 42 and, therefore, it is not believed necessary to repeat that discussion. The movement of the other suction nozzles 43–46 transfers the positions of the lead frames 28B, 28C, 28D and 28E to the next positions of the lead frames 28C, 28D, 28E and 28F, respectively. The up-and-down vertical movement and the horizontal shifting movement of the nozzles 42–46 are so timed as not to interfere with the forward and rearward movement of the front wall 13; that is, the nozzles 42–46 are vertically moved and shifted in front of and/or in back of the front wall 13. In the variant embodiment described above, when the nozzles are lifted above the upper edge of the front wall 13, such precise timing between the drive units 48; 50; and 11, 12 is not necessary.

Washing means are located in the washing chamber 7, and are only operative when the front wall 13 is in its closed position. The washing means includes a top washer 52 on which a plurality of downwardly-facing nozzles 81 (see FIGS. 7 and 11) are arranged, and a bottom washer 53 on which a plurality of upwardly-facing nozzles 82 (see FIG. 7) are arranged. The top and bottom washers 52, 53 are connected to, and along, a rod 56 via respective lead pipes 54, 55. The upper end of the rod 56 is mounted on, for joint movement with, a movable nut 58 through which a threaded rod 57 is horizontally passed in threaded engagement. The lower end of the rod 56 is horizontally guided by a horizontally-extending guide member 59 for slip movement therewith.

The threaded rod 57 is connected to a reversible drive motor 60 mounted on the partition wall 2. The motor 60 is coupled via a worm gear mechanism 61 to one end of the threaded rod 57. In operation, the rod 57 reversibly rotates, thereby reciprocating the nut 58 lengthwise along the rod 57. At the same time, the top and bottom washers 52, 53, which are mounted for joint movement with the nut 58, are horizontally reciprocated lengthwise along the rod 57.

A set of high-pressure water pumps 62, 63 (see FIG. 4) is arranged in the pump chamber 9. The pumps 62, 63 convey water or analogous washing fluids under pressure along pipes 64, 65 to a common delivery pipe 66 and, thereupon, along flexible hoses 67, 68 to top and bottom washers 52 and 53, respectively. The water issuing from nozzles 81 of top washer 52 are jet sprays which are directed from above onto the upper major surface of the lead frame 28C. The water issuing from the nozzles 82 of bottom washer 53 are jet sprays which are directed from below onto the lower major surface of the lead frame 28D. Both lead frames 28C and 28D are located within the washing chamber 7.

The waste water falls to the bottom of the washing chamber 7 onto the bottom partition wall 6 which, due to its rearward and downward inclination, directs the water to its lowermost level. Thereupon, a circular-type water pump 70, via waste pipe 69 which is connected to the lowermost level of the washing chamber, is operative to pump the waste water into a waste tank 71. The waste water in the tank 71 is then sent to a clear water tank 74 via a high-pressure filter 73 by means of a water pump 72. Then the clear water is returned from the clear water tank 74 to the pumps 62, 63 for re-delivery to the top and bottom washers, as described above.

An exhaust fan 75 in communication with the interior of the washing chamber 7 is mounted on the top of the casing 1. The exhaust fan 75 is operative for discharging the hot and humid air in the washing chamber 7 to the exterior environment. The exhaust fan helps to protect the transfer means from corrosion in the event that some of the hot and humid air in the washing chamber 7 escapes to the transfer chamber 8 when the front wall 13 is in its open position. The fan also permits the ventilation openings 87 formed in the opposite sides of the casing 1 to be omitted, thereby facilitating the maintenance and inspection of the arrangement.

Figure 7:
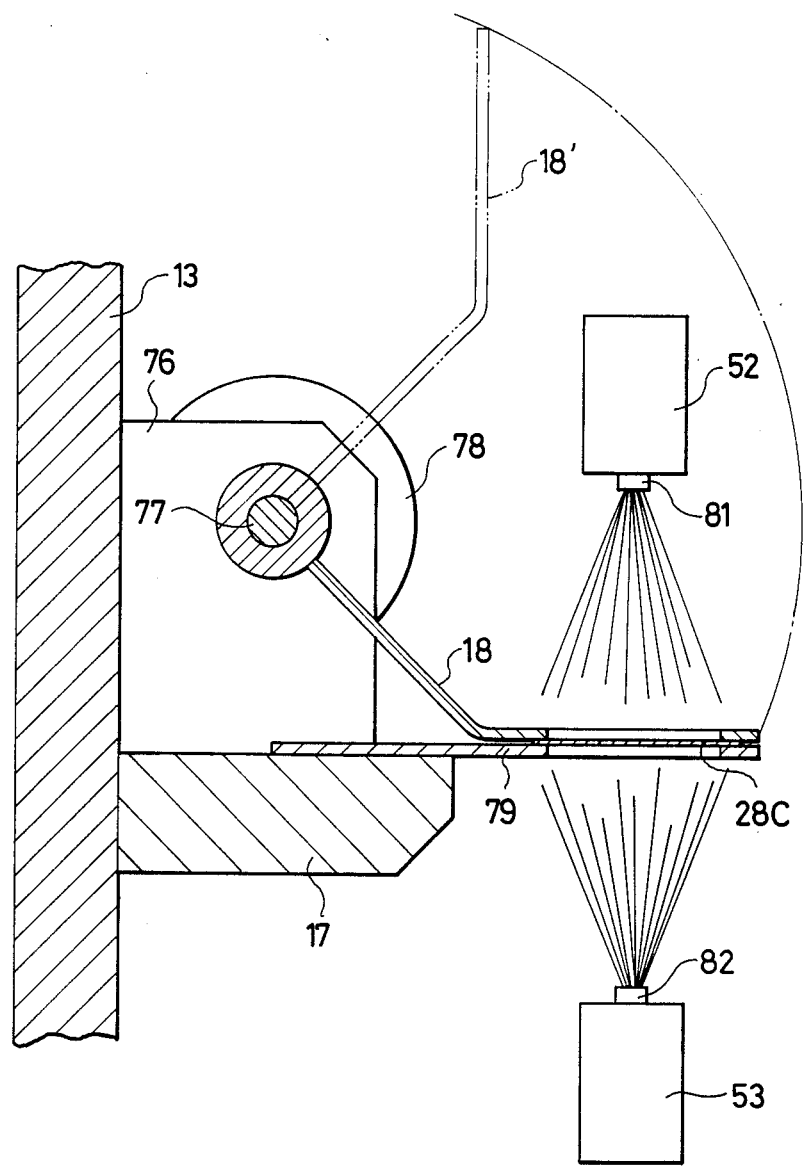
FIG. 7 is an enlarged, partly broken-away, longitudinal cross-sectional view of a detail of the arrangement of FIGS. 3-6.
Figure 8:
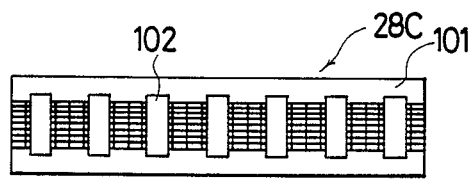
FIG. 8 is an elevational view of a lead frame of a semiconductor product to be washed by the arrangement of FIGS. 3-6.

Turning now to FIG. 7, the top and bottom washers 52 and 53 are shown in enlarged scale and in cooperation with the components of the arrangement mounted at the rear of the front wall 13. As described previously, the mask 18 is pivotably mounted for movement about a pivot shaft 77 which is supported by brackets 76 mounted to the rear of the front wall 13. The mask 19 is similarly pivoted about the shaft 77 (see FIG. 5). Each mask is simultaneously pivoted by a rotary actuator 78 through a predetermined angle. For example, representative mask 18 is pivoted from the aforementioned access position (designated 18' and shown in phantom lines in FIG. 7) in which the transfer means is free to deposit the lead frame 28C on the shelf 17, and the aforementioned clamped position (shown in solid lines in FIG. 7) in which the deposited lead frame 28C is clamped between the mask 18 and the shelf 17. A support plate 79 is fixedly mounted and extends rearwardly from the support shelf 17. The lead frame 28C, shown in isolation and in top plan view in FIG. 8, is placed on the support plate 79 in the access position of the mask 18. Thereupon, the mask 18 is placed over the lead frame 28C.

Figure 9:
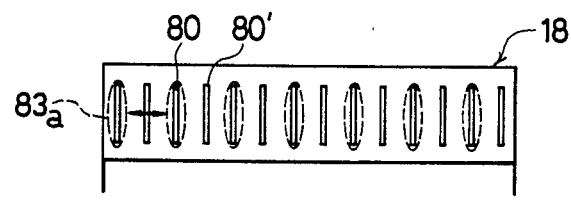
FIG. 9 is an elevational view of a masked holder used with one spray-pattern embodiment of this invention.

The mask 18 is provided with a plurality of slots or openings 80, as shown in FIG. 9. The support plate 79 is also provided with slots or openings in the same size and arrangement as those of the mask 18. The walls of the mask 18 and of the support plate 79 overlie the moldings 102 and those areas of the lead frame which are not to be washed. Thus, it is not necessary to wash the moldings 102 (FIGS. 1 and 2) and the predominant portion of the leads 103 (FIGS. 1 and 2) of the lead frame 101 (FIGS. 1 and 2). The slots 80 of the mask 18 and of the support plate 79 overlie those portions of the lead frame which are to be washed, and these define the area where the burrs are to be removed.

For example, returning to FIG. 2, the slot 80 in phantom lines delimits the areas on the lead frame 101 which are to be freed of lead burrs A and dam burrs B.

Figures 11A, 11B:
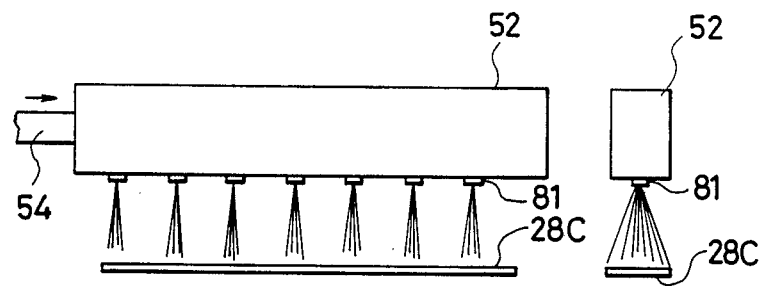

The water jets from each nozzle 81 or 82 of the top and bottom washers 52 or 53 spread in a fan pattern along the width of the lead frame 28C or 28D (see FIGS. 11a and 11b). As shown in FIG. 9, in one spray pattern embodiment of this invention, each jet defines an oval area 83a which spreads widthwise of the mask 18. In addition, during the issuance of water from the nozzles 81 or 82 of the top and bottom washers 52 or 53, the top and bottom washers 52 and 53 are reciprocated along the longitudinal direction denoted by the double-headed arrow in FIG. 9, thereby washing the entire upper and lower major surfaces of the lead frames 28C and 28D, respectively (see FIG. 5). For example, during such reciprocating movement, a representative water jet moves from the slot 80 to the next adjacent slot 80'.

It is preferable, but not necessary, if the nozzles 81 and 82 of the top and bottom washers 52 and 53 are aligned at the same spacings as the moldings 102 of the lead frames 28C and 28D.

Figure 10:
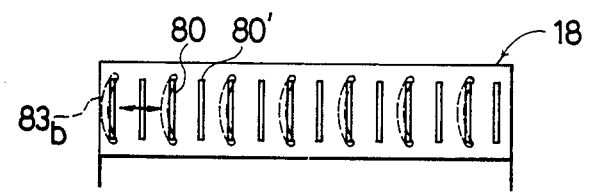
FIG. 10 is an elevational view of a masked holder used with another spray-pattern embodiment of this invention.

Other spray pattern embodiments are also within the scope of this invention. Thus, as shown in FIG. 9, each oval-shaped area 83a has its longer dimension aligned with the slots 80. However, as shown in FIG. 10, rather than an oval shape, these areas can be arcuate in shape. The arcuate areas 83b of FIG. 10 can be advantageously obtained by directing water through the lead pipe 54 in FIG. 11a in a direction perpendicular to the issuing water jets. In this case, both end portions of the arcuate areas 83b of FIG. 10 lag behind, as considered in the direction of advancement of the washers, the central portion of the arcuate areas 83b. The arcuate areas 83b shown in FIG. 10 provide for an improved washing efficiency because the cross-section of the water distribution along each arcuate area is substantially the same, whereas, by contrast, the oval areas 83a shown in FIG. 9 have wider central portions as compared to the corresponding cross-section of their ends.

Figure 12:
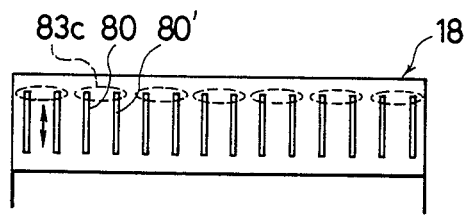
FIG. 12 is an elevational view of a masked holder used in still another spray-pattern embodiment of this invention.

In a variant embodiment, as shown in FIG. 12, oval areas 83c are turned 90° relative to the oval areas 83a of FIG. 9. Thus, the oval areas 83c spread the water jets along the longitudinal direction of the lead frame. In this case, the top and bottom washers 52, 53 are reciprocated along the width of the lead frames 28C and 28D. In addition, each nozzle 81 or 82 washes two adjacent slots 80 and 80' simultaneously.

Furthermore, in this last embodiment, the nozzles may be of the direct-jet type, rather than of the fan-pattern type, and may correspond in number and spacing to the slots 80 and 80' of the lead frame 28C or 28D. Although the number of nozzles in this embodiment increases, compared to the previous embodiment, the water jets are centralized upon the slots 80 and 80', and the water is not spread or directed toward those portions of the lead frames which are not to be washed. This results in a very strong and effective washing and, in addition, the water pressure can be reduced.

Figure 13:
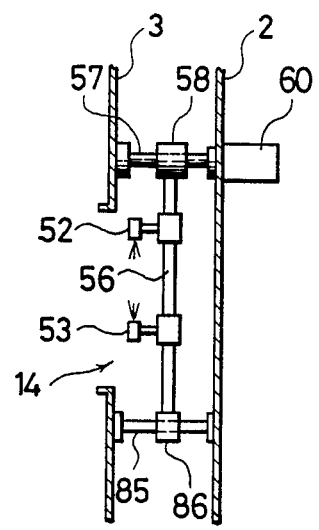
FIG. 13 is a longitudinal cross-sectional side view of an alternate drive for moving the washers within the washing chamber of the arrangement of FIGS. 3-6.

The top and bottom washers 52 and 53 are reciprocated widthwise of the lead frames 28C and 28D by means of a drive, shown in FIG. 13. In this case, the rod 56 is provided with an upper nut 58 at its upper end. A threaded rod 57 is horizontally passed in threaded engagement through the upper nut 58. The front and the rear ends of the threaded rod 57 extend horizontally between the partition walls 2 and 3. A drive motor 60 for the rod 57 is coupled to the rear end of the rod 57, and is operative to reversibly rotate the rod 57. A guide member 86 is mounted at the lower end of the rod 56, and a guide rod 85 passes horizontally through the guide member 86 and is disposed in parallel with the rod 57 between the partition walls 2 and 3. Thus, when the motor is actuated, the upper nut 58 is moved lengthwise along the rod 57 which, as noted previously, extends along the width of the lead frames to be washed. The top and bottom washers 52 and 53, which are connected to the nut 58 and which participate in the movement of the nut, are reciprocated along the length of the rod 57.

The operation of the washing arrangement is believed to be apparent from the above discussion, but for the sake of completeness, it will be briefly repeated as follows:

The lead frames 28 stacked in the magazine 29 are pushed up, one by one, each in its respective turn, by the drive unit 31, and are simultaneously pushed forwardly, one by one, each in its respective turn, to the supply workstation 21 by the drive unit 27. Thereupon, the transfer means T comprising the suction nozzles 42–46, the support bar 47, the drive unit 48, the shiftable block 49, the drive unit 50 and the guide bar 51 are operative to move the lead frames 28 through the workstations along the travel path 20.

When the front wall 13 is in its open position, and when the mask 18 is in its access position, the support plate 79 is now ready to receive the lead frame 28C. Thereupon, when the front wall 13 is moved rearwardly to its closed position, the top washer 52 conveys the pressurized water through nozzles 81 toward the openings 80 in the mask 18 to remove any burrs located within such openings. At the same time, the lead frame 28D, whose upper surface was previously washed by the top washer 52, is now located above the bottom washer 53 so that the pressurized water issuing from the jets 82 is directed onto the lower surface of the lead frame 28D to remove any burrs located in the mask openings in the support plate 79. As noted previously, the top and bottom washers 52 and 53 may be reciprocated one or more times to ensure that the burrs are, in fact, removed.

Returning to FIG. 5, and also referring to FIG. 3, in the drying workstation 23, the dryer 34 dries the lead frame 28E by directing hot air at temperatures of around 100° C.

After the washing and drying of the lead frames are completed, the front wall 13 is moved to its open position and, at this time, the suction nozzles 42–46 are shifted to their right, as shown in solid lines in FIG. 3.

Thereupon, the masks 18 and 19 are moved to the access positions, and the lead frame 28F in the discharge workstation 24 is lowered by one thickness of the lead frame by lowering the rod of the unit 40. Thereupon, the support bar 47, together with the suction nozzles 42–46, are lowered into the workstations and onto the lead frames therein, whereupon the suction force is generated to grip the lead frames.

Next, the suction nozzles 42–46 are lifted, together with the lead frames, a small distance upwardly, for example, to the height occupied by position 42B in FIG. 3, and are then shifted toward the left, as described previously. The suction nozzles are then lowered; the suction forces are then removed; and the suction nozzles, this time without the lead frames, are lifted above the upper edge of the front wall 13, after which, the suction nozzles are returned to their original positions.

When the magazine 38 in the discharge workstation 24 is filled, the magazine 38 is pushed forwardly by the drive unit 37.

In the operation described above, the lifting and shifting motions may be overlapped, at least in part, so as to increase the overall speed and efficiency of the washing arrangement.

It will be understood from the foregoing, and referring to FIG. 3, that the transfer means T is arranged outside the hot and humid environment of the washing chamber 7 and, with the aid of the exhaust fan 75, is reliably protected from corrosion. The inspection of the apparatus can be conducted readily and conveniently. Maintenance intervals can be spaced further apart than heretofore.

It will be understood that each of the elements described above, or two or more together, also may find a useful application in other types of constructions differing from the types described above.

While the invention has been illustrated and described as embodied in a washing arrangement for and method of washing lead frames, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the invention.

What is claimed is:

1. An arrangement for removing burrs of moldable substances from upper and lower major surfaces of lead frames on portions on which the burrs were undesirably applied during molding, said arrangement comprising:

(a) washing means, including a washing workstation, for directing washing fluids under pressure to upper and lower major surfaces of lead frames within the washing workstation, said washing workstation having a closeable washing chamber bounded by walls, one of said walls being movable between a closed position in which said washing chamber is closed and an open position in which said washing chamber is open, wherein the washing means include holder means for holding the lead frames within the washing workstation, said holder means including at least one holder mounted on said one movable wall for joint movement therewith;

(b) means for moving said one movable wall between said open and closed positions in which the washing chamber is opened and closed, respectively;

(c) supply means, including a supply workstation, for successively supplying burr-bearing frames to the washing workstation;

(d) dryer means, including a drying workstation, for successively drying the lead frames washed by the washing means;

(e) discharge means, including discharge workstation, for successively discharging the lead frames dried by the dryer means; and (f) transfer means conveying the lead frames along a path through the workstation, said transfer means being at all times located outside the closed washing chamber and being mounted and operative to convey each lead frame from the supply workstation to and from the washing workstation when said one movable wall is situated in said open position and to successively convey each lead frame after washing through the drying workstation and to the discharged workstation;

wherein said moving means constitute means for reciprocally moving said entire wall between said open and closed positions in a direction both substantially perpendicular to said path of the lead frames through said workstations and substantially perpendicular to a face of said wall;

said washing chamber comprises at least one lateral fixed wall extending in a direction substantially perpendicular to said path of travel;

said transfer means are mounted to be reciprocal toward and away from said path of travel, constitute means for transferring each individual frame through the workstations by contact with the same, and include a plurality of suction nozzles, one for each lead frame, and means for lowering each suction nozzle into engagement with a respective lead frame in a workstation, for thereupon lifting each engaged suction nozzle to raise the respective lead frame, for thereupon shifting each raised suction nozzle downstream along the path to the next workstation, and for thereupon lowering each shifted suction nozzle into the next workstation to constitute an operating cycle; and wherein the said transfer means are mounted to repeat the operating cycle to convey the lead frames consecutively through the workstations.

2. The arrangement as recited in claim 1, wherein the washing means include top and bottom washers respectively arranged above and below the lead frames within the washing chamber, said top washer being mounted and operative for directing the washing fluids onto the upper surface of a lead frame within the washing chamber, said bottom washer being mounted and operative for directing the washing fluids onto the lower surface of another lead frame within the washing chamber.

3. The arrangement as recited in claim 2, wherein the washers are mounted to be movable, and wherein the washing means include means for reciprocally moving the washers along the path.

4. The arrangement as recited in claim 2, wherein the washers are mounted to be movable, and wherein the washing means include means for reciprocally moving the washers transversely of the path.

5. The arrangement as recited in claim 1, wherein the holder include a stationary support plate stationarily mounted on the one movable wall, and a movable plate mounted for movement relative to the stationary plate between an access position in which each lead frame is mounted on the stationary plate, and a clamped position in which the respective lead frame is clamped between the stationary and movable plates.

6. The arrangement as recited in claim 5, wherein the stationary and movable plates have a plurality of masked openings extending to the upper and lower surfaces of the lead frames, and wherein the top and bottom washers direct the respective washing fluids through the masked openings.

7. The arrangement as recited in claim 6, wherein the masked openings are spaced apart from one another along a longitudinal direction, and wherein each opening is elongated in a transverse direction perpendicular to the longitudinal direction, and wherein each washer includes a plurality of nozzles, one for each opening.

8. The arrangement as recited in claim 7, wherein the nozzles are arranged along a linear row.

9. The arrangement as recited in claim 7, wherein the nozzles are arranged along an arcuate course.

10. The arrangement as recited in claim 1, wherein the supply means include a magazine in which the burr-bearing lead frames are arranged in a stack, and means for advancing the stack of lead frames through the magazine.

11. The arrangement as recited in claim 1, wherein the discharge means include a magazine in which the washed lead frames are deposited in a stack, and means for withdrawing the stack of deposited lead frames through the magazine.

12. The arrangement as recited in claim 1, wherein the drying means include a hot air dryer.

13. The arrangement as recited in claim 1; and further comprising means for evacuating the atmosphere within the washing chamber to the ambient environment.

14. The arrangement of claim 1, wherein said path of travel is substantially linear.

15. The arrangement of claim 1, wherein said transfer means additionally comprise an intermediate workstation situated between said supply workstation and washing workstation.

16. The arrangement of claim 1, wherein said washing chamber additionally comprises
a pair of lateral, fixed walls extending in said substantially perpendicular direction to said path of travel.

17. The arrangement of claim 1, wherein said reciprocally moving means move said entire wall in a substantially horizontal direction.

18. A method of removing the burrs of moldable substances from upper and lower major surfaces of lead frames on portions on which the burrs were undesirably applied during molding, comprising the steps of:
(a) directing washing fluids under pressure in a washing workstation having a closeable washing chamber to upper and lower major surfaces of lead frames therein;
(b) moving a movable wall bounding the closeable washing chamber of the washing workstation between open and closed positions in which the washing chamber is opened and closed, respectively, wherein holder means for holding the lead frames within the washing workstation include at least one holder mounted on the movable wall for joint movement therewith;
(c) successively supplying burr-bearing lead frames from a supply workstation to the washing workstation;
(d) successively drying in a drying workstation the lead frames washed during the washing step;
(e) successively discharging in a discharging workstation the lead frames dried during the drying step; and
(f) conveying the lead frames along a path through the workstation, and conveying each lead frame from the supply workstation to and from the washing workstation in the open position of the one movable wall, and successively conveying each lead frame, after the washing step, through the drying workstation and to the discharged workstation, said conveying step being performed by a transfer assembly at all times located outside the closed washing chamber and away from the hot and humid environment therein;
wherein said entire movable wall is reciprocally moved between said open and closed positions in a direction both substantially perpendicular to said path of the lead frames through said workstations, and substantially perpendicular to a face of said wall; and
the transfer assembly is mounted above the path of travel for reciprocal up and down movement away and toward the path of travel.

19. The method of claim 18, wherein said entire wall is moved substantially horizontally.

* * * * *